(12) United States Patent
Osinski et al.

(10) Patent No.: US 9,354,062 B2
(45) Date of Patent: May 31, 2016

(54) ROTATION-SENSITIVE SEMICONDUCTOR RING LASER DEVICE USING THE NONLINEAR SAGNAC EFFECT

(71) Applicants: Marek A. Osinski, Albuquerque, NM (US); Petr G. Eliseev, Albuquerque, NM (US); Edward W. Taylor, Albuquerque, NM (US)

(72) Inventors: Marek A. Osinski, Albuquerque, NM (US); Petr G. Eliseev, Albuquerque, NM (US); Edward W. Taylor, Albuquerque, NM (US)

(73) Assignee: STC.UNM, Albuquerque, NM (US)

(*) Notice: Subject to any disclaimer, the term of this patent is extended or adjusted under 35 U.S.C. 154(b) by 236 days.

(21) Appl. No.: 13/987,911

(22) Filed: Sep. 16, 2013

(65) Prior Publication Data
US 2015/0260521 A1    Sep. 17, 2015

Related U.S. Application Data

(60) Provisional application No. 61/701,698, filed on Sep. 16, 2012.

(51) Int. Cl.
| | |
|---|---|
| *G01C 19/72* | (2006.01) |
| *H01S 3/102* | (2006.01) |
| *G02F 1/35* | (2006.01) |
| *G01C 19/66* | (2006.01) |

(52) U.S. Cl.
CPC .............. *G01C 19/727* (2013.01); *G01C 19/66* (2013.01); *G02F 1/3519* (2013.01); *H01S 3/1028* (2013.01)

(58) Field of Classification Search
CPC ...... G01C 19/727; G01C 19/72; G01C 19/64; G01C 19/725; G01C 19/66–19/70
See application file for complete search history.

(56) References Cited

U.S. PATENT DOCUMENTS

| | | | |
|---|---|---|---|
| 6,937,342 B2 | 8/2005 | Osinski | 356/461 |
| 2003/0030814 A1* | 2/2003 | Osinski et al. | 356/461 |
| 2003/0219193 A1* | 11/2003 | Litvin | 385/15 |

OTHER PUBLICATIONS

Wright et al. "Theory of nonlinear Sagnac effect in a fiber-optic gyroscope" Phys. Rev. A, vol. 32, No. 5, (Nov. 1985).*
A.P. Bogatov et al., Anomalous Interaction of Spectral Modes in a Semiconductor Laser, vol. QE-11, No. 7. Jul. 1975.
Hongjun Cao et a., Frequency beating between monolithically integrated semiconductor ring lasers, Applied Physics Letters 86, 041101 (2005).
Hongjun Cao et al. Large S-Section-Ring-Cavity Diode Lasers: Directional Switching, Electrical Diagnostics, and Mode Beating Spectra, IEEE Photonics Technology Letters, vol. 17, No. 2, Feb. 2005.
Hongjun Cao et al., Highly unidirectional InAs/InGaAs quantum-dot ring lasers, Applied Physics Letters 86, 203117, (2005).
H.-J. Cao et al., Microwave frequency beating between monolithically integrated quantum-dot ring lasers, Electroncis Letters, vol. 43, No. 25, Dec. 6, 2007.

(Continued)

*Primary Examiner* — Michael A Lyons
*Assistant Examiner* — Dominic J Bologna

(57) ABSTRACT

Method and apparatus embody a rotation sensor including one or more ring lasers designed to utilize a nonlinear Sagnac effect, a passive waveguide arrangement, and a photodetector arrangement to receive the outcoupled light and to detect rotation of the sensor; wherein these components are arranged into a monolithically integrated optoelectronic integrated circuit on a single substrate. The method and apparatus can include seeding a stable, rotation-insensitive, strong (driving) wave using a single-frequency edge emitting laser monolithically integrated on the same substrate.

42 Claims, 7 Drawing Sheets

(56) References Cited

OTHER PUBLICATIONS

P.G. Eliseev, Spectral perturbations in a semiconductor laser: II. Nonlinear interaction of modes, Quantum Electronics, 35(9), 791-794, 2005.

Petr G. Eliseev et a., Nonlinear mode interactions as a mechanism to obtain slow/fast light in diode lasers, Phys sics and Simulation of Optoelectronic Device XIV, vol. 6115, 2006.

P.N. Lebedev et al., Theory of nonlinear Sagnac effect, Opto-Electronics Review 16(2), No. 2, 2008.

Masanori Koshiba et al., A Vector Finnite Element Method With the High-Order Mixed-Interpolation-Type Triangular Elements for Optical Waveguiding Problems, Journal of Lightwave Technology Vo. 12, No. 3, Mar. 1994.

C. Liu et al., Anomalous splitting in microwave mode-beating spectra of semiconductor ring lasers, Electronics Letters, vol. 41, No. 17, Aug. 18, 2005.

Marek A. Osinski et al., Monolithically integrated twin ring diode lasers for rotation sensing applications, Journal of Crystal Growth, 288, 2006.

Dirk Schulz et al., Mixed Finite Element Beam Propagation Method, Journal of Lightwave Technology, vol. 16, No. 7, Jul. 1998.

M. Sorel et al., Alternate oscillations in semiconductor ring lasers, Optics Letters, vol. 27, No. 22, Nov. 2002.

A.V. Uskov et al., Slow and superluminal light in semiconductor optical amplfiers, Electroncis Letters, vol. 41, No. 16, 2005.

Natham Withers et al., Y-Junction-C-Coupled S-Section InAs/InGa/As/GaAs Quantum—Dot Ring Lasers with High Directionality, Optical. Society of America 2007.

Yasuhide Tsuji e tal., Guided-Mode and Leaky-Mode Analysis by Imaginary Distance Beam Propagation Method Based on Finite Element Scheme, Journal of Lightwave Techonology, Vo 18, No. 4, Apr. 2000.

Kunimasa Saitoh, Full-Vecorial Imaginary-Distance Beam Propagation Method Based on a Finite Element Scheme: Application to Photonics Crystal Fibers, IEEE Journal of Quantum Electronics vol. 38, No. 7, Jul. 2002.

\* cited by examiner

ROTATION-SENSITIVE SEMICONDUCTOR RING LASER DEVICE USING THE NONLINEAR SAGNAC EFFECT

RELATED APPLICATION

This application claims benefits and priority of U.S. provisional application Ser. No. 61/701,698 filed Sep. 16, 2012, the entire disclosure of which is incorporated herein by reference.

This invention was made with government support under Grant No. HQ00061007325 awarded by the Missile Defense Agency. The government has certain rights in the invention.

FIELD OF THE DISCLOSURE

The present application is directed to a laser gyroscope based on nonlinear Sagnac effect.

BACKGROUND OF THE DISCLOSURE

Optical rotation-sensitive devices were demonstrated by Sagnac and some other experimentalists with non-coherent light sources and with closed-path interferometers (triangular or multi-angular). These schemes belong to passive gyroscope types. Since the emergence of lasers, two new types of rotation-sensitive devices appeared: 1) passive type, with a laser replacing a lamp as an external light source; 2) active type, incorporating a laser inside a ring resonator, with the frequency difference between counterpropagating modes depending on the rotation rate $\Omega$. In the first type of rotation-sensitive devices, the measured parameter is the phase shift between counterpropagating beams, whereas in the second type the measured parameter is the mode beating frequency $\Delta v$. The slope sensitivity of an active rotation-sensitive device is $$K = \frac{d(\Delta v)}{d\Omega},$$

where K is also called the (gyroscopic) scaling factor, $\Omega$ is the angular rotation rate, and $\Delta v$ can be represented as $$\Delta v = \frac{4A\Omega}{n_g \lambda L}, \quad (1)$$

where A is a ring area, L is its perimeter length, $n_g$ is the group index of the medium filling the resonator volume, $$n_g = n + \frac{v \, dn}{dv}, \quad (2)$$

and n is the refractive index of the same medium. It can be seen from Eq. (1) that the size parameter of A/L is very important to increase the slope sensitivity. This parameter depends on the shape of the ring. For a given area, A/L is maximum in a circular resonator, where for a circle of radius R we have $$\frac{A}{L} = \frac{R}{2}. \quad (3)$$

Circular resonators can be easily realized with guiding structures, such as in optical fibers or optoelectronic integrated circuits (OEICs).

If R=1 cm (which is close to the physical limit for OEICs), K≈5000 in a ring filled with a typical semiconductor material, such as GaAs ($n_g$≈4). An example of the conventional technique is the active rotation-sensitive hybrid ring laser, as shown in FIG. 1. The active element is a semiconductor optical amplifier 1, included inside an optical fiber loop 2. The frequency beating signal has been measured using a self-pickup technique, in the form of voltage oscillations appearing in the pumping circuitry of the semiconductor optical amplifier. This technique is based on the phenomenon of electrical response to the light intensity inside the active region of a laser or amplifier. The frequency beating between counterpropagating modes leads to oscillations of local light intensity and corresponding oscillations in electrical voltage. Detecting these oscillations gives the beating frequency and the rotation rate. In the scheme of FIG. 1, the semiconductor optical amplifier occupies only a small part of the ring length (about 1 mm in a 15-cm long loop). In contrast, in a monolithically integrated semiconductor ring, its whole length is filled with a semiconductor medium containing a p-n junction. In this case, the pickup technique should be modified, and the beating signal will not be obtained with a single electrode to the whole ring. To increase the slope sensitivity K, the size of the ring cavity can be increased in terms of the factor A/L. However, due to technological limitations, only a small improvement in gyro sensitivity can be expected using this approach. The present invention embodies the potential for a dramatic increase in slope sensitivity using the nonlinear Sagnac effect (NLSE), by exploiting nonlinear mode interactions in semiconductor lasers that can produce effective group indices close to zero.

The NLSE is a phenomenon deviating from normal Sagnac effect due to a change in the refractive index dispersion $$\frac{dn}{dv},$$

caused by parametric interactions of waves in a nonlinear medium (such as in semiconductor lasers). In a strong electromagnetic field, the optical parameters are perturbed in the vicinity of a strong wave frequency. A relatively small perturbation of the refractive index n ($10^{-3}$-$10^{-4}$) that occurs over a very narrow spectral range (frequency range of $10^{10}$-$10^{11}$ $s^{-1}$), produces a substantial perturbation of the refractive index dispersion $$\frac{dn}{dv}(10^{10} - 10^{11} s^{-1}),$$

comparable to its linear part. This means that in the range where the induced nonlinear dispersion is negative, it can compensate or even overcompensate the linear (positive) part and give the total dispersion close to zero or even negative. The result is a significant increase in the beating frequency (1), due to $n_g$ approaching zero. The spectral point where $n_g \to 0$ is sometimes called the point of critically anomalous dispersion (CAD). In the vicinity of this point, superluminal light propagation, with the group velocity significantly higher than the speed of light in vacuum c, must be taken into account. Features of the CAD point are that the group index $n_g$ passes through zero, and the group velocity has a discontinuity, going to infinite values of opposite signs depending on which side the CAD point is approached from. The usual identification of the photon velocity with the group velocity of light is not working in this case, and a commonly accepted approach of wave packets is not valid. In order to use the NLSE in practice for an increase in the rotation sensitivity, the operation point should be chosen not at the CAD point but in its close vicinity (in the superluminal range). It corresponds to a usage of the so called fast light.

The frequency shift associated with the perturbation of the refractive index in the vicinity of the frequency $v_s$ of the driving wave can be shown to be given by the following expression:

$$\Delta v = \left(\frac{4A\Omega}{L}\right) \times \{\lambda n_{g,lin} - (2\pi c C |E_0|^2)(1 - 2\alpha x - x^2)/[\gamma^2(1 + x^2)]2\}^{-1}, \quad (4)$$

where $C=-B(N-N_0)(de''/dN)/(2n)$, $N_0$ is the carrier density, $N_0$ is the transparency carrier density, $\in''$ is the imaginary part of the dielectric constant, $\gamma$ is the carrier relaxation rate, B is the bimolecular recombination coefficient (in units of $m^2/V^2s$), $\alpha$ is the line width broadening factor, $x=2\pi(v_s-v)/\gamma$ is the normalized detuning with respect to the strong wave frequency $v_s$, and $n_{g,lin}$ is the linear (unperturbed) component of the group index.

SUMMARY OF THE DISCLOSURE

In accordance with some aspects of the present disclosure, an apparatus is described that includes a rotation sensor that comprises a ring laser designed to utilize a nonlinear Sagnac effect; a passive waveguide arranged to couple the light out from the ring laser; a photodetector arranged to receive the light generated by the ring laser via the passive waveguide and to detect rotation of the sensor; wherein the ring laser, the passive waveguide, and the photodetector are arranged into a monolithically integrated optoelectronic integrated circuit on a single substrate.

The rotation sensor can include in one illustrative embodiment a first unidirectional ring laser arranged in a first ring arrangement designed to utilize (exhibit) a nonlinear Sagnac effect; a second unidirectional ring laser arranged in a second ring arrangement designed to utilize (exhibit) a nonlinear Sagnac effect; a three-port passive waveguide combiner arranged to combine the output light from the first and second unidirectional ring lasers into a single waveguide; a first passive waveguide arranged to couple the light from the first ring arrangement to the three-port waveguide combiner; a second passive waveguide arranged to couple the light from the second ring arrangement to the three-port waveguide combiner; a third passive waveguide arranged to further guide the light generated by the first and second lasers by collecting it at the three-port waveguide combiner and mixing it together; a photodetector arranged to receive the light generated by the first and the second ring arrangements and to detect rotation of the sensor, wherein the first unidirectional ring laser, the second unidirectional ring laser, the three-port passive waveguide combiner, the first passive waveguide, the second passive waveguide, the third passive waveguide, and the photodetector are arranged into a monolithically integrated optoelectronic integrated circuit on a single substrate. In some embodiments, the unidirectional operation of the ring lasers can be promoted by the use of redirecting waveguides, strongly coupled to the waves propagating in the undesirable direction.

In some embodiments, the unidirectional ring lasers can have a compound cavity structure, designed to reduce the number of longitudinal modes in a large ring cavity and thereby to increase the power in the driving wave(s).

In some embodiments, the compound-cavity unidirectional ring lasers can be formed by connecting two or more rings together using three-port couplers.

In some embodiments, the compound-cavity unidirectional ring lasers can be formed by connecting two or more rings together through their evanescent fields.

In some embodiments, the strong wave frequency can be controlled by injecting each ring laser with a stable, rotation-insensitive optical signal from a single-frequency edge-emitting laser, such as a distributed Bragg reflector (DBR) or distributed feedback (DFB) laser monolithically integrated on the same chip.

In some embodiments, the optical signal from the single-frequency edge-emitting laser can be split into two parts, using a three-port Y-junction that delivers the signal to injecting waveguides.

In some embodiments, each injecting waveguide leading the light from the single-frequency edge-emitting laser to one of the ring lasers can form an asymmetric Y-like junction with the resonator waveguide of that ring laser.

In some embodiments, each injecting waveguide leading the light from the single-frequency edge-emitting laser to one of the ring lasers can form a directional coupler with that ring laser.

In some embodiments, the contact electrodes to each ring can be segmented in at least three sections per ring for direct pick-up of rotation sensing information through measurements of terminal voltage.

In some embodiments, the three-port passive waveguide combiner and the compound-cavity unidirectional ring lasers coupled by three-port couplers can include one or more Y-junctions or Y-like junctions.

In some embodiments, the light generated by the first laser can propagate in a single direction in the first ring arrangement and the light generated by the second laser can propagate in the opposite single direction in the second ring arrangement.

In some embodiments, the rotation sensor can include one or more heater modules arranged to tune the first ring arrangement and the second ring arrangement to each other and to control modal content of compound cavity ring resonators.

In some embodiments, the first passive waveguide can form a directional coupler with the first ring arrangement and the second passive waveguide can form a directional coupler with the second ring arrangement.

In some embodiments, the photodetector can be arranged to detect a beating signal produced by coupling the signals from the first ring arrangement and the second ring arrangement. The beating signal can result from rotation of the sensor due to the nonlinear Sagnac effect and can correspond to a slope sensitivity that is used to determine a rotation rate of the sensor.

In some embodiments, the rotation sensor can include one or more monitoring photodetectors, arranged to monitor operation and signal passage in the sensor, with corresponding waveguides leading the light from the lasers to the monitoring photodetectors.

In some embodiments, the waveguides leading the light from the ring lasers to the monitoring photodetectors can form directional couplers with the first and second ring arrangements.

In some embodiments, the waveguides leading the light from the ring lasers to the monitoring photodetectors have tapered ends, and the photodetector facets are oriented at the Brewster angle with respect to the waveguide axis, in order to reduce or eliminate possible reflections back to the ring lasers.

In some embodiments, the signal from the third passive waveguide can be directed out from the chip and collected outside the chip for further analysis.

In some embodiments, the signals from the first and second passive waveguides can be directed out from the chip and combined outside the chip for further analysis.

In accordance with some aspects of the present disclosure, the rotation sensor can include a ring laser designed to utilize (exhibit) a nonlinear Sagnac effect; a single-frequency edge-emitting laser, such as a distributed Bragg reflector (DBR) or distributed feedback (DFB) laser, designed to seed a stable, rotation-insensitive strong wave inside the said ring laser; an injecting waveguide arranged to couple the light from the said single-frequency edge-emitting laser to the said ring laser; a photodetector arranged to receive the light generated by the said ring laser and to detect rotation of the sensor; an outcoupling waveguide arranged to couple the light from the said ring laser to the said photodector; wherein the said ring laser, the single-frequency edge-emitting laser, the injecting waveguide, the outcoupling waveguide, and the photodetector are arranged into a monolithically integrated optoelectronic integrated circuit on a single substrate.

In some embodiments, a monolithically integrated photodetector can be placed at the back side of the single-frequency edge-emitting laser to monitor its output.

In some embodiments, the injecting waveguide leading the light from the single-frequency edge-emitting laser to the said ring laser can form an asymmetric Y-like junction with the ring laser resonator waveguide.

In some embodiments, the injecting waveguide leading the light from the single-frequency edge-emitting laser to the said ring laser can form a directional coupler with the said ring laser.

In some embodiments, the rotation sensor can include a monitoring photodetector, arranged to monitor unidirectionality of the ring laser, with a corresponding waveguide leading the light from the said ring laser to the monitoring photodetector.

In some embodiments, the outcoupling waveguide leading the light from the said ring laser to the photodetector(s) can form a directional coupler with the said ring laser.

In some embodiments, the signal from the said outcoupling waveguide can be directed out from the chip for further analysis.

In some embodiments, the contact electrode to the said ring laser can be segmented in at least three sections for direct pick-up of rotation sensing information through measurements of terminal voltage.

In accordance with some aspects of the present disclosure, a method is described that can include providing a rotation sensor by providing a first unidirectional ring laser arranged in a first ring arrangement designed to utilize (exhibit) a nonlinear Sagnac effect in response to sensor's rotational movement; providing a second unidirectional ring laser arranged in a second ring arrangement designed to utilize (exhibit) a nonlinear Sagnac effect in response to sensor's rotational movement; providing a three-port passive waveguide combiner arranged to combine the output light from the first and second unidirectional ring lasers into a single waveguide; providing a first passive waveguide arranged to couple the light from the first ring arrangement to the three-port waveguide combiner; providing a second passive waveguide arranged to couple the light from the second ring arrangement to the three-port waveguide combiner; providing a third passive waveguide arranged to further guide the light generated by the first and second lasers by collecting it at the three-port waveguide combiner and mixing it together; providing a photodetector arranged to receive the light generated by the first and the second ring arrangements and to detect rotation of the sensor, wherein the first unidirectional ring laser, the second unidirectional ring laser, the three-port passive waveguide combiner, the first passive waveguide, the second passive waveguide, the third passive waveguide, and the photodetector are arranged into a monolithically integrated optoelectronic integrated circuit on a single substrate. The method includes rotating the sensor in gyroscope service applications such that the first and second ring lasers exhibit the nonlinear Sagnac effect.

In some embodiments, the method can also include promoting the unidirectional operation of the ring lasers by the use of redirecting waveguides, strongly coupled to waves propagating in the undesirable direction.

In some embodiments, the method can also include providing a compound cavity structure for unidirectional ring lasers, designed to reduce the number of longitudinal modes in a large ring cavity and thereby increase the power in the driving wave(s).

In some embodiments, the compound-cavity unidirectional ring lasers can be arranged to couple two or more rings together using three-port couplers.

In some embodiments, the compound-cavity unidirectional ring lasers can be arranged to couple two or more rings together through their evanescent fields.

In some embodiments, the method can also include controlling the strong wave frequency by injecting each ring laser with a stable, rotation-insensitive optical signal from a single-frequency edge-emitting laser, such as a distributed Bragg reflector (DBR) or distributed feedback (DFB) laser monolithically integrated on the same chip.

In some embodiments, the method can also include splitting the optical signal from the single-frequency edge-emitting laser into two parts, using a three-port Y-junction that delivers the split signal to injecting waveguides.

In some embodiments, the method can also include forming an asymmetric Y-like junction that connects the injecting waveguide, leading the light from the single-frequency edge-emitting laser, with the resonator waveguide of one of the ring lasers.

In some embodiments, the method can also include forming a directional coupler between the injecting waveguide, leading the light from the single-frequency edge-emitting laser, and one of the ring lasers.

In some embodiments, the method can also include segmenting the contact electrodes to each ring in at least three sections per ring for direct pick-up of rotation sensing information through measurements of terminal voltage.

In some embodiments, the three-port passive waveguide splitter, the three-port passive waveguide combiner, and the compound-cavity unidirectional ring lasers coupled by three-port couplers can be arranged to include one or more Y-junctions or Y-like junctions.

In some embodiments, the light generated by the first laser can be arranged to propagate in a single direction in the first ring arrangement and the light generated by the second laser can be arranged to propagate in the opposite single direction in the second ring arrangement.

In some embodiments, the method can include providing one or more heater modules arranged to tune the first ring arrangement and the second ring arrangement to each other and to control modal content of compound cavity ring resonators.

In some embodiments, the method can include forming a directional coupler between the first passive waveguide and the first ring arrangement, and forming another directional coupler between the second passive waveguide and the second ring arrangement.

In some embodiments, the method can include arranging the photodetector to detect a beating signal produced by coupling the signals from the first ring arrangement and the second ring arrangement. The beating signal can result from the nonlinear Sagnac effect in a rotating sensor and can correspond to a slope sensitivity that is used to determine the rotation rate of the sensor.

In some embodiments, the method can include monitoring operation and signal passage in the sensor by one or more photodetectors, with corresponding waveguides leading the light from the lasers to the monitoring photodetectors.

In some embodiments, the method can include forming directional couplers between the waveguides leading the light from the lasers to the monitoring photodetectors and the first and second ring arrangements.

In some embodiments, the method can include tapering the ends of the waveguides leading the light from the ring lasers to the monitoring photodetectors, and orienting the facets of the monitoring photodetectors at the Brewster angle with respect to the waveguide axis, in order to reduce possible reflections back to the ring lasers.

In some embodiments, the method can include directing the signal from the third passive waveguide out from the chip and collecting it outside the chip for further analysis.

In some embodiments, the method can include directing the signals from the first and second passive waveguides out from the chip and combining them outside the chip for further analysis.

In accordance with some aspects of the present disclosure, a method is described that can include providing the rotation sensor comprising a ring laser designed to utilize (exhibit) a nonlinear Sagnac effect; a single-frequency edge-emitting laser, such as a distributed Bragg reflector (DBR) or distributed feedback (DFB) laser, designed to seed a stable, rotation-insensitive strong wave inside the said ring laser; an injecting waveguide arranged to couple the light from the said single-frequency edge-emitting laser to the said ring laser; a photodetector arranged to receive the light generated by the said ring laser and to detect rotation of the sensor; an outcoupling waveguide arranged to couple the light from the said ring laser to the said photodector; wherein the said ring laser, the single-frequency edge-emitting laser, the injecting waveguide, the outcoupling waveguide, and the photodetector are arranged into a monolithically integrated optoelectronic integrated circuit on a single substrate. The method includes rotating the sensor in gyroscope service applications such that the said ring laser exhibits the nonlinear Sagnac effect.

In some embodiments, the method can include providing a monolithically integrated photodetector, placed at the back side of the single-frequency edge-emitting laser to monitor its output.

In some embodiments, the method can include providing an injecting waveguide, leading the light from the single-frequency edge-emitting laser to the said ring laser, that forms an asymmetric Y-like junction with the ring laser resonator waveguide.

In some embodiments, the method can include providing an injecting waveguide, leading the light from the single-frequency edge-emitting laser to the said ring laser, that forms a directional coupler with the said ring laser.

In some embodiments, the method can include providing a monitoring photodetector, arranged to monitor unidirectionality of the ring laser, with a corresponding waveguide leading the light from the said ring laser to the monitoring photodetector.

In some embodiments, the method can include providing an outcoupling waveguide, leading the light from the said ring laser to the photodetector(s), that forms a directional coupler with the said ring laser.

In some embodiments, the method can include directing the signal from the said outcoupling waveguide out from the chip for further analysis.

In some embodiments, the method can include segmenting the contact electrode to the said ring laser in at least three sections for direct pick-up of rotation sensing information through measurements of terminal voltage.

In some embodiments of the present disclosure, an active rotation-sensitive laser device is described, based on monolithically integrated semiconductor unidirectional ring lasers. The active rotation-sensitive laser device can be designed for usage of the electromagnetically-induced negative frequency dispersion (nonlinear Sagnac effect) in order to increase the slope rotation sensitivity at a given size of the device.

In some embodiments, the active rotation-sensitive laser device includes one or more composite laser, where a composite (two or more coupled rings) cavity is used to concentrate the laser emission power in a single spectral mode or in a few spectral modes to form high-intensity driving wave(s) in the active medium of the rotation-sensitive laser device.

In some embodiments, the active rotation-sensitive laser device can include resonator parameters that are favorable for the operation in a spectral mode detuned with respect to the driving wave by an optimal spectral distance in order to realize the nonlinear enhancement of anomalous dispersion in the operation mode.

In some embodiments, the active rotation-sensitive laser device can include sectioned electrodes to each of semiconductor unidirectional ring lasers for obtaining the mode beating signal in the self-pickup regime.

In some embodiments, the active rotation-sensitive laser device can include spatially distanced sections of electrodes to the laser components in order to obtain the direction-sensitive self-pickup signal, to determine a sign of the frequency splitting from the beating signal, and to determine the direction of the rotation.

Additional embodiments and advantages of the disclosure will be set forth in part in the description which follows, and can be learned by practice of the disclosure. The embodiments and advantages of the disclosure will be realized and attained by means of the elements and combinations particularly pointed out in the appended claims.

It is to be understood that both the foregoing general description and the following detailed description are exemplary and explanatory only, and are not restrictive of the disclosure, as claimed.

The accompanying drawings, which are incorporated in and constitute a part of this specification, illustrate several embodiments of the disclosure and, together with the description, serve to explain the principles of the disclosure.

DETAILED DESCRIPTION OF THE EMBODIMENTS

Figure 1:
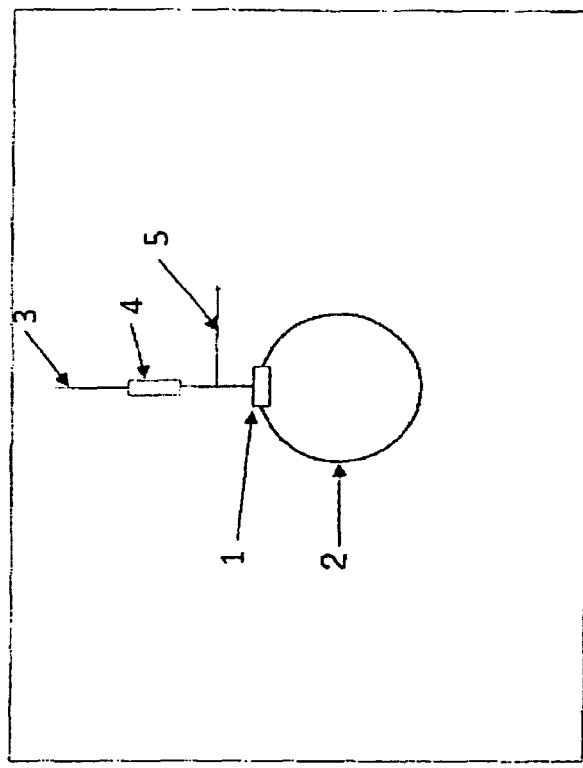
FIG. 1 shows a conventional hybrid rotation-sensitive laser device, as described in prior art.

Reference will now be made in detail to various exemplary embodiments of the present application, which are illustrated in the accompanying drawings. Wherever possible, the same reference numbers will be used throughout the drawings to refer to the same or like parts.

For the purposes of this specification and appended claims, unless otherwise indicated, all numbers expressing quantities, percentages or proportions, and other numerical values used in the specification and claims, are to be understood as being modified in all instances by the term "about". Accordingly, unless indicated to the contrary, the numerical parameters set forth in the following specification and attached claims are approximations that can vary, depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

In the following detailed description, numerous specific details are set forth in order to provide a thorough understanding of the invention. However, it will be understood by those skilled in the art that the present invention may be practiced without these specific details. In other instances, well-known methods, procedures, components, and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing", "computing", "calculating", "determining", "analysis", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission, or display devices.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

In accordance with some aspects of the present disclosure, an increase of the aforementioned slope sensitivity K with no further increase of the ring size is described using the known electromagnetically-induced negative frequency refractive index dispersion (nonlinear Sagnac effect) wherein the nonlinear Sagnac effect (NLSE) involves significant reduction in the group refractive index of a probe (weak) wave caused by nonlinear interactions between longitudinal modes of a ring laser, such that the effective group index at the probe wave frequency approaches zero. Certain conditions are considered for effective usage of the NLSE. A first condition is a presence of a high-intensity driving wave in the modal volume of the first and second unidirectional ring lasers. A strong mode of laser emission can be used as the driving wave. Its frequency is denoted as $v_s$. The driving wave produces a perturbation of the complex refractive index in the vicinity of $v_s$. The intensity of the driving wave should be high enough to reach the appearance of CAD (critically anomalous dispersion) points in the spectrum of the laser emission of the rotation sensing device. The CAD threshold (the intensity that should be reached to achieve the condition of $n_g=0$) should be calculated and experimentally verified for each laser structure used in the rotation sensing device.

A second condition is that the rotation-sensitive low-intensity wave should be located at a frequency v that is optimally detuned with respect to the driving wave. The detuning $v-v_s$ is determined as the algebraic sum of the detuning to the selected CAD point and detuning of operational point with respect to the CAD point (to avoid an instability associated with discontinuity of group velocity at the CAD point):

$$v-v_s=(v-v_{CAD})+(v_{CAD}-v_s). \quad (5)$$

A third condition is that the optimization of the operation point leads to a condition that the detuning according to Eq. (5) should be equal to the longitudinal mode spacing $$\partial v = \frac{c}{n_g L}, \quad (6)$$

where L is the perimeter length of the ring cavity. The condition $$v - v_s = \frac{c}{n_g L} \quad (7)$$

allows one to keep the operation point on an invariable detuning distance from the driving wave because both spectral points v and $v_s$ correspond to neighboring longitudinal modes of the ring resonator. In principle, the mode spacing itself changes also due to a perturbation of the complex refractive index of the active medium. Therefore, a very strong perturbation will change the detuning of the operation point with respect to the driving wave, and this change should be taken into account. For example, solution of the wave equation and equation for nonlinearity of the active medium leads to the position of a suitable CAD point at the frequency $$v_{CAD}=v_s+\alpha\gamma, \quad (8)$$

where $\alpha$ is the coefficient of the order of unity (when the intensity of the driving wave is far above the CAD-threshold), and $\gamma$ is the relaxation rate of the charge carriers in the electron subsystem of the laser medium. The operation frequency $v_{op}$, of the ring laser using the NLSE corresponds to a small detuning $\delta$ from the CAD point. Ultimately, this frequency should correspond to the expression $$v_{op}=v+\alpha\gamma+\delta. \quad (9)$$

It is assumed that the Sagnac splitting $\Delta v$ is always much smaller than the detuning $\delta$.

In accordance with some aspects of the present disclosure, the active rotation-sensitive laser device is based on monolithically integrated semiconductor unidirectional ring lasers and designed for usage of the electromagnetically-induced negative frequency dispersion (nonlinear Sagnac effect) in order to increase the slope rotation sensitivity K at a given size of the device.

Figure 2:
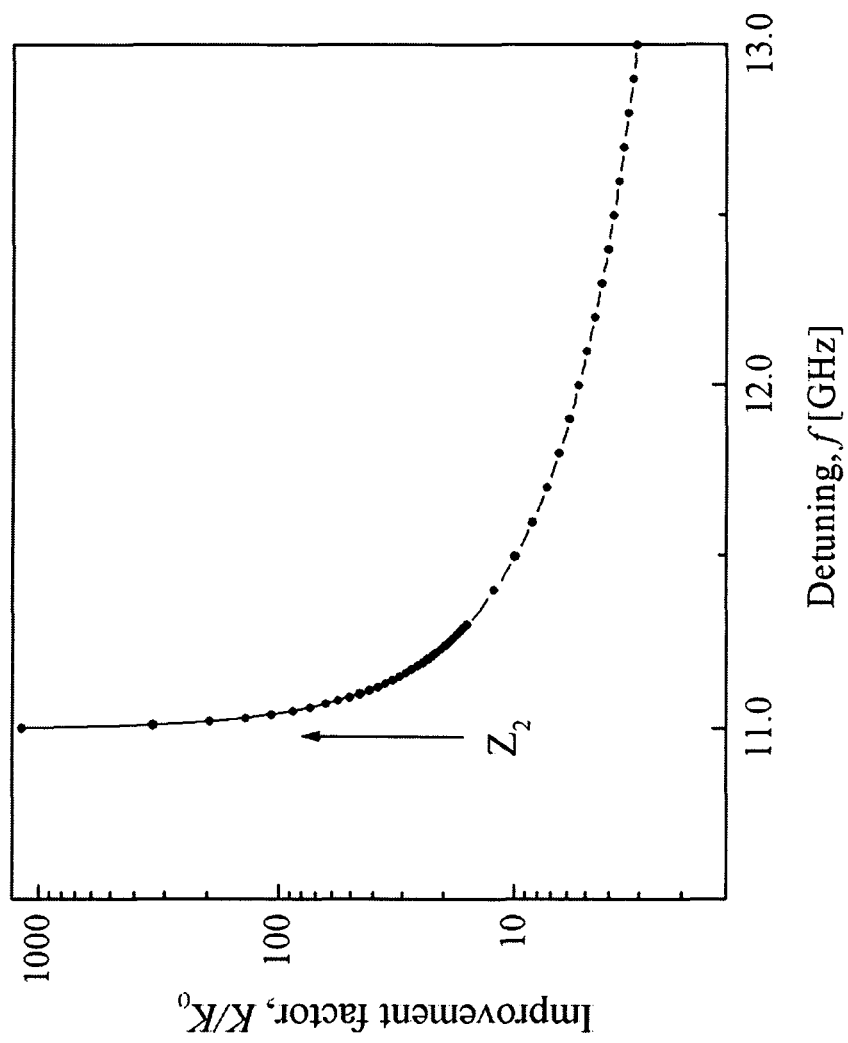
FIG. 2 shows the dependence of the improved scaling factor $K/K_0$ (where $K_0$ is the background (linear) slope sensitivity of the same ring laser) on the operation frequency, in accordance with aspects of the present disclosure.

The rotation-sensitive optical device is of the active laser type (laser gyro), with the slope sensitivity (enhanced gyro scaling factor) $K=d\Delta v/d\Omega$ in accordance with the induced anomalous dispersion (or the NLSE). The effective use of the NLSE can be realized by presence of a driving (strong) wave that is one of the possible modes in the ring laser cavity, and by location of the operation point for a probe (weak) wave at an optimized spectral distance from the driving wave. The weak wave is also one of the possible modes in the ring laser cavity. The frequency of the weak mode is close to, but not identical to the critically anomalous dispersion (CAD) point, where the group index approaches zero value. The dependence of K on the weak mode frequency becomes steeper as the CAD point marked as $Z_2$ in FIG. 2 is approached. Therefore, the improvement in the scaling factor is limited by the increasing instability of the Sagnac-related signal associated with the steepness of the K=K(v) curve. An expected increase of K is at least 100-1000, depending on the detuning $\delta$. This allows the rotation-sensitive device to increase the slope sensitivity with little to no increase in the device size. As such, the monolithically integrated rotation sensing laser device can be significantly smaller in size as compared to other laser gyros. For example, typical size of the rotation sensing laser device chip (i.e, an optoelectronic integrated circuit) is around 1 $cm^2$, whereas hybrid (diode laser+fiber loop) rotation sensing device has an area of ~500 $cm^2$.

FIG. 1 shows schematically a conventional hybrid rotation-sensing laser device, as discussed above, including a semiconductor laser (amplifier) chip 1 and an optical fiber loop 2. The scheme has been tested on a turntable and has been shown to produce a measurable Sagnac-related beating frequency (Taguchi 1998). The detection of the Sagnac-related signal is performed using the self-pickup technique. The laser chip serves as a detector of mode beating, and the frequency is measured at the output 3 at the end of a high resistance connection 4, whereas the dc pumping is applied through a connection 5 with much smaller resistance.

FIG. 2 shows the calculated dependence of the improved scaling factor $K/K_0$ (where $K_0$ is the background (linear) slope sensitivity of the same ring laser) on the operation frequency. The Sagnac-related frequency splitting is assumed to be much smaller than the detuning from the $Z_2$ (CAD) point. The position of the critical point $Z_2$ is shown by an arrow. The scaling factor is shown to increase rapidly in the vicinity of the CAD point.

For the laser rotation sensor of the active type with semiconductor laser (or amplifier) and fiber loop of FIG. 1, the ring can be divided into three or more sections that supply simultaneous pumping current to each section. This arrangement is suitable to collect the self-pickup signal related to the Sagnac effect. Signals from two sections in a sectioned ring can be monitored and compared in order to determine the phase of electrical response in each monitored section and subsequently to determine the orientation of the rotation (a sign of the rotation rate vector).

Figure 3:
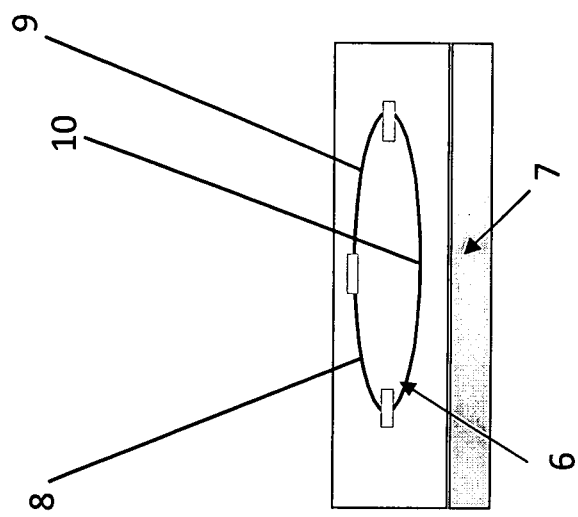
FIG. 3 shows an example scheme of sectioned ring cavity to obtain the beating frequency by the self-pickup technique, in order to determine the sign of the rotation rate vector in accordance with aspects of the present disclosure.

FIG. 3 shows an example scheme of a sectioned ring cavity to obtain the beating frequency by the self-pickup technique and to determine the sign of the rotation rate vector in accordance with aspects of the present disclosure. A monolithically integrated active ring 6 is formed on substrate 7, typically by epitaxial growth followed by cleanroom processing. Wires 8, 9, and 10 connected to independent electrodes on the active ring 6 are configured to determine the sign of the rotation rate vector and arranged at three sections of the monolithically integrated active ring 6. Substrate 7 can be made either of a semiconductor material, such as GaAs or InP, or other suitable material, for example a dielectric, such as sapphire used for the growth of group-III nitride materials. The backside of a semiconductor substrate provides a uniform lower electrode common for all sections (not shown in FIG. 3). If the substrate is made of a dielectric material, all the contacts are deposited from the top side, as would be appreciated by those skilled in the art. Under rotation conditions, the frequency splitting of counterpropagating waves produces a moving standing wave. The direction of motion of this moving standing wave depends on the direction of rotation (sign of the rotation rate vector). The direction of rotation can be determined by measuring the phase shifts between the Sagnac-related signals taken from wires 8, 9, and 10. The absolute value of the rotation rate can be determined by measuring the scalar frequency splitting.

The laser ring length should be chosen in order to satisfy the requirement of Eq. (9), namely, the total spectral distance from the driving wave should be equal to the mode spacing in the ring, as given by Eq. (6):

$$\alpha\gamma + \delta = \delta v = \frac{c}{n_g L}. \qquad (10)$$

From Eq. (10), the optimal value for the ring length is $$L = (c/n_g)(\alpha\gamma+\delta)^{-1} \qquad (11)$$

Strong perturbation of $n_g$ is limited to a very small spectral range, therefore the group index $n_g$ in Eq. (11) corresponds to an unperturbed value. In this version of the ring laser, a numerical example can be as follows:
c=2.997×10$^{10}$ cm/s,
$n_g$=4,
$\alpha$=0.6 (for power flow in the driving wave ~500 W/cm$^2$),
$\gamma$=10$^{10}$ s$^{-1}$,
$\delta$=5 MHz.

The calculated optimal cavity length is 7.3 mm. Also, the cavity lengths of 14.6 and 21.9 mm are valid, because in all of these cases one of the longitudinal modes of the ring cavity will be located at the optimal operation point with respect to the frequency of the driving wave.

The usefulness of the detection of the Sagnac-related signal can be further improved by usage of the self-pickup technique with three or more electrodes to a sectioned ring connected to wires 8, 9, 10, as shown in FIG. 3. In this arrangement, the signals from three or more sections separated electrically, but attached to the same optical ring, can be monitored. The phase shift between these monitor signals provides information needed to determine the direction of rotation, in addition to the determination of the absolute value of the rotation rate from the Sagnac-related frequency splitting.

In order to concentrate the laser power in the driving mode, an additional spectral selectivity in the ring cavity is desirable. This requirement can be satisfied by usage of a composite-ring cavity containing at least two rings of different size, coupled either by a three-port (for example, Y-junction type) waveguide couplers or by an evanescent-wave (directional) coupler. The lasing in a composite-ring cavity occurs in the spectral modes that are common to both rings. The selectivity of this method should be optimized empirically, in order to not suppress the oscillation in the weak mode experiencing the nonlinear Sagnac effect.

Figure 4:
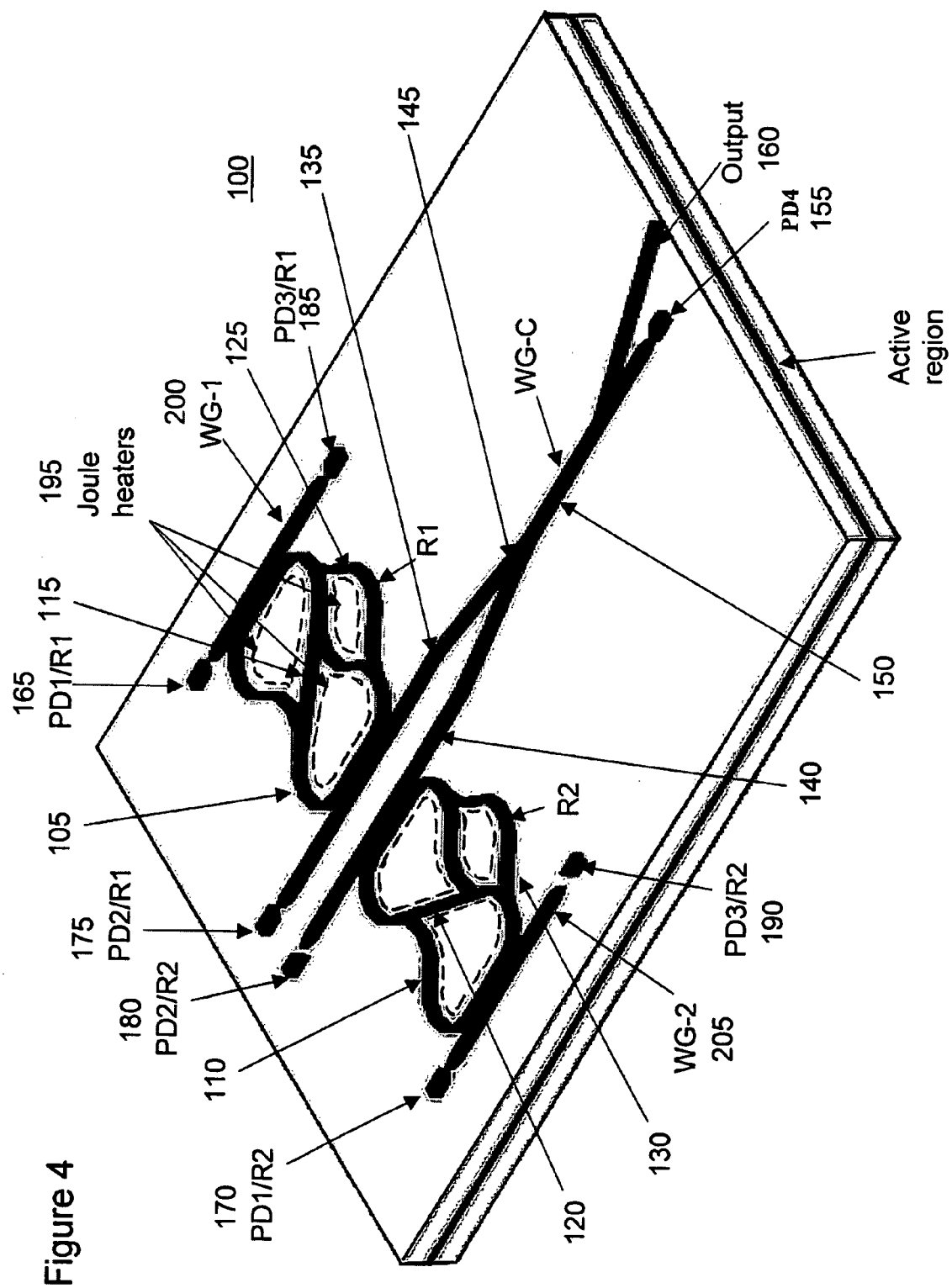
FIG. 4 shows an example arrangement of a rotation sensing device optimized for nonlinear Sagnac-effect (NLSE) enhancement of gyro sensitivity in accordance with aspects of the present disclosure, with compound ring laser cavity formed using three-port couplers.

FIG. 4 shows an example of a rotation sensing device in accordance with an embodiment of the present disclosure. In the description below, the three-port coupler will be described by example as a Y-junction; however, this is merely an example arrangement. Other types of three-port junctions can be used, as would be apparent to those skilled in the art. The rotation sensing device 100 can be arranged as a monolithically integrated OEIC on a single substrate made either of a semiconductor material, such as GaAs or InP, or other suitable material, for example a dielectric, such as sapphire used for the growth of group-III nitride materials, and can include several components designed for enhancement of gyro sensitivity via the nonlinear Sagnac effect (NLSE). The lasers R1 105 and R2 110 are ring lasers with redirecting waveguide sections 115 and 120 that favor a unidirectional operation in counterpropagating directions in each ring. The redirecting sections can be straight waveguides as shown in FIG. 4, or can have an S-shape. Other shapes are also possible. Each of the two unidirectional rings 105 and 110 comprises a compound cavity designed and effective to select at least one strong wave producing anomalous dispersion of the group index, and at least one weak wave that operates at a frequency close to the CAD point so as to utilize or exhibit the nonlinear Sagnac effect when the sensor is rotated in gyroscope service applications. The compound cavity in FIG. 4 is formed by adding to each ring at least one additional branch 125 and 130 of a different perimeter length. Passive waveguides 135 and 140 are arranged in a directional coupler configuration with the unidirectional ring lasers R1 105 and R2 110, respectively, to transport optical outputs from the said unidirectional ring lasers to a passive Y-junction waveguide combiner 145. The output from the passive waveguide combiner 145 is guided by a passive waveguide WG-C 150 to an integrated photoreceiver, such as a photodiode PD4 155, and/or to an optical output waveguide 160. The passive waveguide WG-C 150 is the mixing section of emission from both unidirectional ring lasers that serves to deliver the emission to the photoreceiver PD4 155 and/or to direct it outside the chip for detection by an external photoreceiver. Optional monitoring photodetectors PD1/R1 165, PD1/R2 170, PD2/R1 175, PD2/R2 180, PD3/R1 185, and PD3/R2 190 serve the purpose of monitoring the levels of counterpropagating light outputs from the ring lasers R1 105 and R2 110, respectively, to verify their unidirectional operation. Possible reflections from the waveguide/photodetector interfaces are reduced or eliminated by tapering the waveguides and orienting the photodetector facets at the Brewster angle with respect to the waveguide axis. Optional heaters, for example, Joule heaters 195 shown in dashed lines for the unidirectional ring laser 105, and not labeled with a reference number but shown in FIG. 4 for the unidirectional ring laser 110, are ohmic resistors for fine frequency tuning by locally increasing the active region temperature for control of the lasing wavelength in each respective ring or its compound cavity component, in addition to tuning by the driving current. WG-1 200 and WG-2 205 are passive ridge waveguides weakly coupled to unidirectional ring lasers 105 and 110, respectively, for the purpose of monitoring their unidirectional operation and delivering light coupled out from said ring lasers to the photodetectors PD1/R1 165, PD3/R1 185 and PD1/R2 170, PD3/R2 190, respectively. Electrical contacts to the lasers and photodetectors are not shown in FIG. 4, and are formed by standard metal deposition techniques as known to those skilled in the art. Electrical contacts to the ring lasers R1 105 and R2 110 are connected to power supplies, as also is known to those skilled in the art. All passive waveguides may have their independent contacts to bring them close to transparency level, thus reducing their optical losses. Optionally, the passive waveguides can be driven above transparency, allowing for light amplification inside the waveguide. The losses in passive waveguides can also be reduced by quantum well or quantum dot intermixing for OEICs with quantum well or quantum dot active regions.

The use of a twin-ring device that is configured to produce counterpropagating waves separately allows the frequency lock-in in the ring cavity to be avoided. The lock-in is the phenomenon that can limit the operation of the rotation sensing device at very low rotation rates and can occur as a result of mutual coupling of counterpropagating waves (particularly due to optical backscattering). The twin-ring system 100 contains two nearly identical (although not necessarily perfectly identical) ring cavities R1 105 and R2 110 with independent pumping. Each ring of the twin-ring system is designed for unidirectional operation through redirection of the waves propagating in the undesirable direction using crossover straight waveguides 115 and 120 (as in FIG. 4) or S-shaped waveguides. By this arrangement, the mode beating signal is detected at the outlets of the Y-type waveguide WG-C 150 by either the integrated photodetector PD3 160 or an external photoreceiver. The regime of NLSE can be realized in (exhibited by) both ring lasers under influence of a strong (driving) wave that produces a perturbation of the group index for the weak probe wave.

The direction of running waves in the two rings R1 105 and R2 110 is opposite to each other. Therefore, the beating of their modes under the mechanical rotation will appear through the Sagnac effect. Furthermore, the twin scheme can be optimized for operation at a spectral point favorable to the NLSE. Using the same numerical parameters of the particular case discussed above, the optimal length for each ring can be shown to be L=7.3 mm×N, where N is an integer. It is not necessary to have the same L in both rings, as combinations of optimal lengths are also valid (for example $L_1$=7.3 mm and $L_2$=14.6 mm, etc.).

Figure 5:
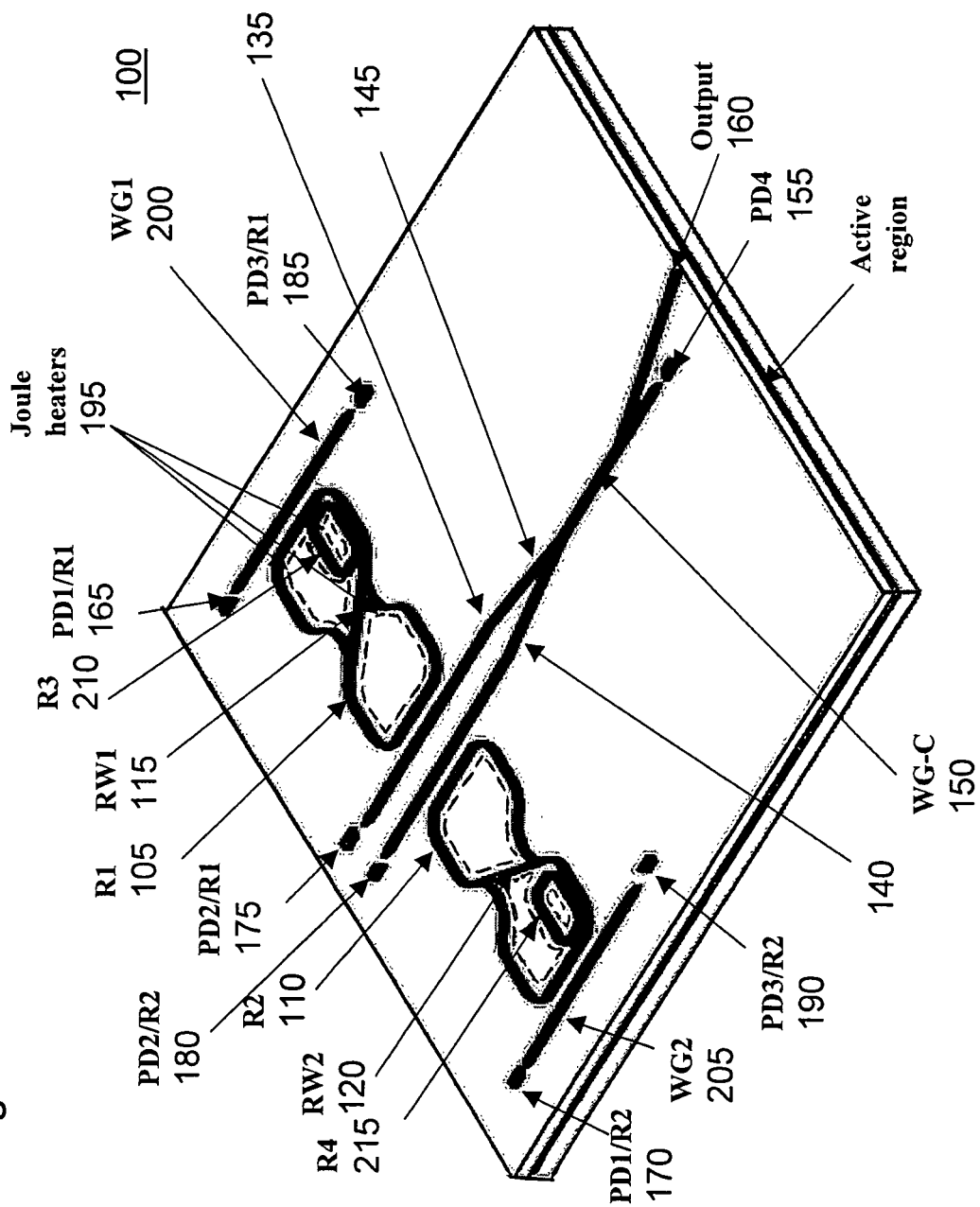
FIG. 5 shows another example arrangement of a rotation sensing device optimized for nonlinear Sagnac-effect (NLSE) enhancement of gyro sensitivity in accordance with aspects of the present disclosure, with compound ring laser cavity formed using evanescent coupling between rings.

FIG. 5 shows another example of a rotation sensing device in accordance with an embodiment of the present disclosure. Each of the two unidirectional rings 105 and 110 comprises a compound cavity, designed to select at least one strong wave producing anomalous dispersion of the group index, and at least one weak wave that operates at a frequency closed to the CAD point. The compound cavity in FIG. 5 is formed by evanescently coupling at least two rings of a different perimeter length. Ring R1 105 in FIG. 5 is evanescently coupled to ring 210, while ring R2 110 is evanescently coupled to ring 215. As shown in FIG. 5, smaller rings 210 and 215 do not contain any direction selective elements, as coupling with larger unidirectional rings itself may be sufficient to achieve unidirectional operation. If necessary, redirecting waveguides similar to elements 115 and 120 in FIG. 4 can be added to smaller rings 210 and 215 in FIG. 5. The functions of all remaining elements of the rotation sensing device in FIG. 5 are the same as in FIG. 4.

Another method to concentrate the laser power in the driving mode is to seed it by using a stable, rotation-insensitive output signal from a single-frequency edge-emitting laser with straight resonant cavity, such as distributed Bragg reflector (DBR or distributed feedback (DFB) semiconductor laser. In order to eliminate problems associated with optical alignment or virations, the single-frequency laser in the preferred embodiment is monolithically integrated with the ring laser(s). The output light from the single-frequency laser can be coupled to each ring laser either by a three-port (for example, Y-junction type) waveguide coupler or by an evanescent-wave (directional) coupler. The stable strong wave, in addition to inducing the nonlinear Sagnac effect, provides a stable reference signal. Beating of that signal with a weak wave with frequency close to the CAD point provides a way of measuring the rotation rate either with two ring lasers (FIG. 6), or even with a single ring laser (FIG. 7).

Figure 6:
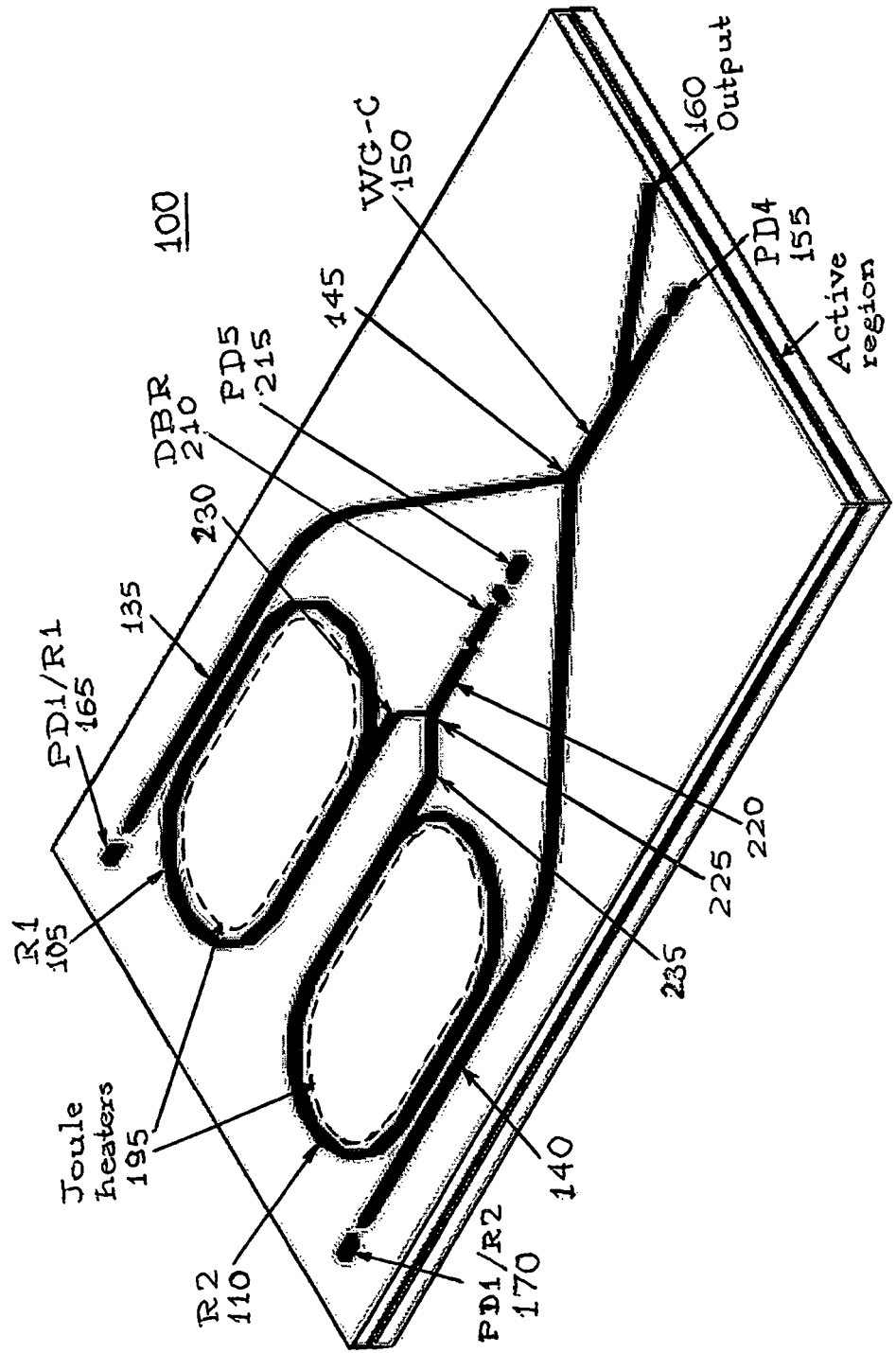
FIG. 6 shows another example arrangement of a rotation sensing device optimized for nonlinear Sagnac-effect (NLSE) enhancement of gyro sensitivity in accordance with aspects of the present disclosure, with a single-frequency edge-emitting laser, such as a distributed Bragg reflector (DBR) or distributed feedback (DFB) laser, designed to seed a stable, rotation-insensitive strong wave inside the ring lasers.

FIG. 6 shows another example of a rotation sensing device in accordance with an embodiment of the present disclosure. In the description below, the three-port coupler will be described by example as a Y-junction; however, this is merely an example arrangement. Other types of three-port junctions can be used, as would be apparent to those skilled in the art. The rotation sensing device 100 can be arranged as a monolithically integrated OEIC on a single substrate, made either of a semiconductor material, such as GaAs or InP, or other suitable material, for example a dielectric, such as sapphire used for the growth of group-III nitride materials, and can include several components designed for enhancement of gyro sensitivity via the nonlinear Sagnac effect (NLSE). The lasers R1 105 and R2 110 are ring lasers that favor a unidirectional operation in counterpropagating directions in each ring through injection of a seeding strong wave, produced by a rotation-insensitive, stable, single-frequency edge-emitting laser 210. The strong wave produces anomalous dispersion of the group index in ring lasers R1 105 and R2 110. The single-frequency laser can be of the distributed Bragg reflector (DBR) type as shown in FIG. 6, or can have a distributed feedback (DFB) structure. Other single-frequency edge-emitting laser designs are also possible. The output from the single-frequency laser 210 is directed through a passive ridge waveguide 220 to a Y-junction splitter 225, which then delivers the split signal to injecting waveguides 230 and 235. The injecting waveguides can be connected with the ring resonators through asymmetric Y-like junctions, as shown in FIG. 6, or they can form directional couplers with the ring resonator waveguides 105 and 110. The operating conditions of the single-frequency laser 210 and the ring lasers R1 105 and R2 110 are adjusted such that the ring resonators can support a strong driving wave producing anomalous dispersion of the group refractive index and at least one week (probe) wave with a frequency close to the CAD point, so as to utilize or exhibit the nonlinear Sagnac effect when the sensor is rotated in gyroscope service applications. Passive ridge waveguides 135 and 140 are arranged in a directional coupler configuration with the ring lasers R1 105 and R2 110, respectively, to transport the optical outputs from the said ring lasers to a passive Y-junction waveguide combiner 145 and to optional monitoring photodetectors PD1/R1 165 and PD1/R2 170. The output from the passive waveguide combiner 145 is guided by a passive waveguide WG-C 150 to an integrated photoreceiver, such as a photodiode PD4 155, and/or to an optical output waveguide 160. The passive waveguide WG-C 150 is the mixing section of emission from both unidirectional ring lasers that serves to deliver the emission to the photoreceiver PD4 155 and/or to direct it outside the chip for detection by an external photoreceiver. The optional monitoring photodetectors PD1/R1 165 and PD1/R2 170 serve the purpose of monitoring the levels of counterpropagating light outputs from the ring lasers R1 105 and R2 110, respectively, to verify their unidirectional operation. An optional backside photodetector PD5 215 serves the purpose of monitoring the output power from the single-frequency laser 210. Possible reflections from the waveguide/photodetector interfaces are reduced or eliminated by tapering the waveguides and orienting the photodetector facets at the Brewster angle with respect to the waveguide axis. Optional heaters, for example, Joule heaters 195 shown in dashed lines for the ring lasers R1 105 and R2 110, are ohmic resistors for fine frequency tuning by locally increasing the active region temperature for control of the lasing wavelength in each respective ring, in addition to tuning by the driving current. Electrical contacts to the lasers and photodetectors are not shown in FIG. 6, and are formed by standard metal deposition techniques as known to those skilled in the art. Electrical contacts to the ring lasers R1 105, R2 110 and to the single-frequency laser 220 are connected to power supplies, as also is known to those skilled in the art. All passive waveguides 135, 140, 150, 160, 220, 230, and 235 may have their independent contacts to bring them close to transparency level, thus reducing their optical losses. Optionally, the passive waveguides can be driven above transparency, allowing for light amplification inside the waveguide. The losses in passive waveguides can also be reduced by quantum well or quantum dot intermixing for OEICs with quantum well or quantum dot active regions.

Figure 7:
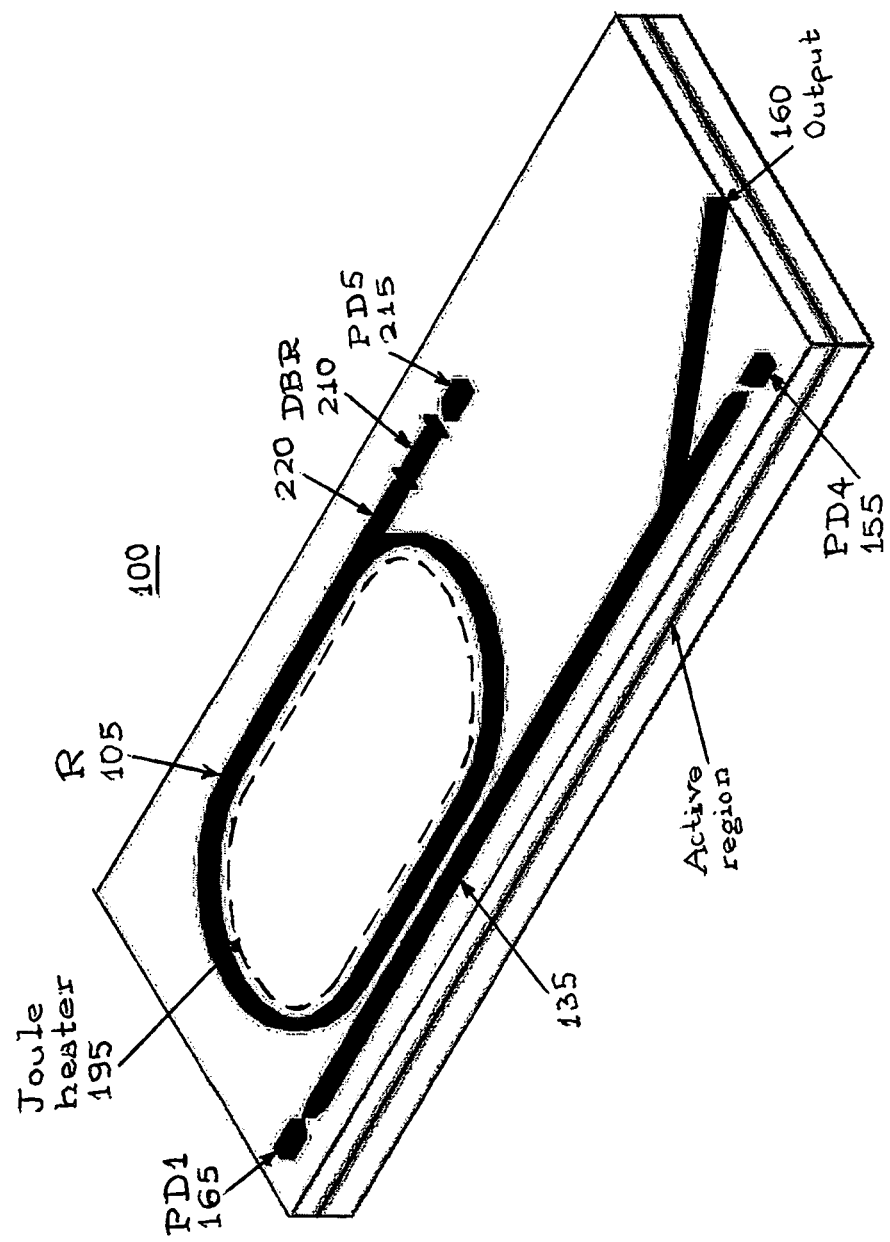
FIG. 7 shows another example arrangement of a rotation sensing device optimized for nonlinear Sagnac-effect (NLSE) enhancement of gyro sensitivity in accordance with aspects of the present disclosure, with a single-frequency edge-emitting laser, such as a distributed Bragg reflector (DBR) or distributed feedback (DFB) laser, designed to seed a stable, rotation-insensitive strong wave inside a single ring laser.

FIG. 7 shows another example of a rotation sensing device in accordance with an embodiment of the present disclosure. The rotation sensing device 100 can be arranged as a monolithically integrated OEIC on a single substrate, made either of a semiconductor material, such as GaAs or InP, or other suitable material, for example a dielectric, such as sapphire used for the growth of group-III nitride materials, and can include several components designed for enhancement of gyro sensitivity via the nonlinear Sagnac effect (NLSE). The ring laser R 105 favors a unidirectional operation through injection of a seeding strong wave, produced by a rotation-insensitive, stable, single-frequency edge-emitting laser 210. The strong wave produces anomalous dispersion of the group index in the ring laser R 105. The single-frequency laser can be of the distributed Bragg reflector (DBR) type as shown in FIG. 7, or can have a distributed feedback (DFB) structure. Other single-frequency edge-emitting laser designs are also possible. The output from the single-frequency laser 210 is directed through a passive injecting waveguide 220 to the ring laser R 105. The injecting waveguide can be connected with the ring resonator through an asymmetric Y-like junction, as shown in FIG. 7, or it can form a directional coupler with the ring resonator waveguide 105. The operating conditions of the single-frequency laser 210 and the ring laser R 105 are adjusted such that the ring resonator can support a strong driving wave producing anomalous dispersion of the group refractive index and at least one week (probe) wave with a frequency close to the CAD point, so as to utilize or exhibit the nonlinear Sagnac effect when the sensor is rotated in gyroscope service applications. A passive ridge waveguide 135 is arranged in a directional coupler configuration with the ring laser R 105, to transport the optical output from the said ring laser to an integrated photoreceiver, such as a photodiode PD4 155, and/or to an optical output waveguide 160 for detection by an external photoreceiver outside the chip, as well as to an optional monitoring photodetector PD1 165. The optional monitoring photodetector PD 1 165 serves the purpose of monitoring the levels of counterpropagating light outputs from the ring lasers R1 105 and R2 110, respectively, to verify their unidirectional operation. An optional backside photodetector PD5 215 serves the purpose of monitoring the output power from the single-frequency laser 210. Possible reflections from the waveguide/photodetector interfaces are reduced or eliminated by tapering the waveguides and orienting the photodetector facets at the Brewster angle with respect to the waveguide axis. An optional heater, for example, a Joule heater 195 shown in dashed lines for the ring laser R1 105, is an ohmic resistor for fine frequency tuning by locally increasing the active region temperature for control of the lasing wavelength in the ring laser R1 105, in addition to tuning by the driving current. Electrical contacts to the lasers and photodetectors are not shown in FIG. 7, and are formed by standard metal deposition techniques as known to those skilled in the art. Electrical contacts to the ring laser R 105 and to the single-frequency laser 220 are connected to power supplies, as also is known to those skilled in the art. All passive waveguides 135, 160, and 220 may have their independent contacts to bring them close to transparency level, thus reducing their optical losses. Optionally, the passive waveguides can be driven above transparency, allowing for light amplification inside the waveguide. The losses in passive waveguides can also be reduced by quantum well or quantum dot intermixing for OEICs with quantum well or quantum dot active regions.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

It is noted that, as used in this specification and the appended claims, the singular forms "a", "an", and "the" include plural referents, unless expressly and unequivocally limited to one referent. As used herein, the term "include" and its grammatical variants are intended to be non-limiting, such that recitation of items in a list is not to the exclusion of other like items that can be substituted or added to the listed items.

Further, in describing representative embodiments of the present disclosure, the specification may have presented the method and/or process of the present disclosure as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequence may be varied and still remain within the spirit and scope of the present disclosure.

Any of the functions described as being performed by a module, component, or system can in some embodiments be performed by one or more other modules, components, or systems. One or more functions described as being performed by different modules, components, or systems can be combined to be performed by one or more common module, component, or system.

The terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g. as in a cause and effect relationship).

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications, variations, improvements, and substantial equivalents.

What is claimed is:

1. A laser gyroscope rotation sensor comprising:
a ring laser designed to utilize a nonlinear Sagnac effect;
another laser arranged to interact with the ring laser to produce a nonlinear Sagnac effect;
a passive waveguide arranged to couple the light out from the ring laser;
a photodetector arranged to receive the light generated by the ring laser and to detect rotation of the sensor using the nonlinear Sagnac effect;
wherein the ring laser, the another laser the passive waveguide, and the photodetector are arranged into a monolithically integrated optoelectronic integrated circuit on a single substrate.

2. A laser gyroscope rotation sensor, comprising:
a first unidirectional ring laser arranged in a first ring arrangement designed to utilize a nonlinear Sagnac effect;
a second unidirectional ring laser arranged in a second ring arrangement designed to utilize a nonlinear Sagnac effect;
a three-port passive waveguide combiner arranged to combine the output light from the first and second unidirectional ring lasers into a single waveguide;
a first passive waveguide arranged to couple the light from the first ring arrangement to the three-port waveguide combiner;
a second passive waveguide arranged to couple the light from the second ring arrangement to the three-port waveguide combiner;
a third passive waveguide arranged to further guide the light generated by the first and second lasers by collecting it at the three-port waveguide combiner and mixing it together;
a photodetector arranged to receive the light generated by the first and the second ring arrangements and to detect rotation of the sensor using the nonlinear Sagnac effect;
wherein the first unidirectional ring laser, the second unidirectional ring laser, the three-port passive waveguide combiner, the first passive waveguide, the second passive waveguide, the third passive waveguide, and the photodetector are arranged into a monolithically integrated optoelectronic integrated circuit on a single substrate.

3. The rotation sensor according to claim 2, further comprising a redirecting waveguide in each of the ring arrangements, strongly coupled to the waves propagating in the undesirable direction.

4. The rotation sensor according to claim 3, wherein the redirecting waveguides are straight waveguides.

5. The rotation sensor according to claim 3, wherein the redirecting waveguides are S-shaped.

6. The rotation sensor according to claim 2, wherein the unidirectional ring lasers have a compound cavity structure effective to reduce the number of longitudinal modes in a large ring cavity and thereby to increase the power in the driving wave(s).

7. The rotation sensor according to claim 6, wherein the compound-cavity unidirectional ring lasers are formed by connecting two or more rings together using three-port couplers.

8. The rotation sensor according to claim 6, wherein the compound-cavity unidirectional ring lasers are formed by connecting two or more rings together through their evanescent fields.

9. The rotation sensor according to claim 2, wherein the three-port passive waveguide combiner includes a Y-junction passive waveguide combiner.

10. The rotation sensor according to claim 2, wherein the compound-cavity unidirectional ring lasers coupled by three-port couplers each include one or more Y-junction waveguide splitters and combiners.

11. The rotation sensor according to claim 2, wherein the lasing light generated by the first laser propagates in a single direction in the first ring arrangement, and the lasing light generated by the second laser propagates in the opposite single direction in the second ring arrangement.

12. The rotation sensor according to claim 2, further comprising one or more heater modules arranged to tune the first ring arrangement and the second ring arrangement to each other and to control modal content of compound cavity ring resonators.

13. The rotation sensor according to claim 2, wherein the first passive waveguide forms a directional coupler with the first ring arrangement, and the second passive waveguide forms a directional coupler with the second ring arrangement.

14. The rotation sensor according to claim 2, wherein the third passive waveguide leading the light from the ring lasers to the photodetector has a tapered end, and the photodetector facet is oriented at the Brewster angle with respect to the waveguide axis, in order to reduce or eliminate possible reflections back to the ring lasers.

15. The rotation sensor according to claim 2, further comprising one or more monitoring photodetectors, arranged to monitor operation and signal passage in the sensor, with corresponding waveguides leading the light from the first and/or second ring arrangements to the monitoring photodetectors.

16. The rotation sensor according to claim 15, wherein the waveguides leading the light from the ring lasers to the monitoring photodetectors form directional couplers with the first and second ring arrangements.

17. The rotation sensor according to claim 15, wherein the waveguides leading the light from the ring lasers to the monitoring photodetectors have tapered ends, and the photodetector facets are oriented at the Brewster angle with respect to the waveguide axis, in order to reduce or eliminate possible reflections back to the ring lasers.

18. The rotation sensor according to claim 2, wherein the signal from the third passive waveguide is directed out from the chip and collected outside the chip for further analysis.

19. The rotation sensor according to claim 2, wherein the signals from the first and second passive waveguides are directed out from the chip and combined outside the chip for further analysis.

20. The rotation sensor according to claim 2, wherein the photodetector is arranged to detect a beating signal produced by coupling the signals from the first ring arrangement and the second ring arrangement, said signals resulting from the nonlinear Sagnac effect produced by rotation of the sensor.

21. The rotation sensor according to claim 20, wherein the beating signal is related to a slope sensitivity that is used to determine a rotation rate of the sensor.

22. A method of sensing rotation, comprising:
a) providing a laser gyroscope rotation sensor by:
providing a ring laser designed to utilize a nonlinear Sagnac effect;
providing another laser arranged to interact with the ring laser to produce a nonlinear Sagnac effect;
providing a passive waveguide arranged to couple the light out from the ring laser;

providing a photodetector arranged to receive the light generated by the ring laser and to detect rotation of the sensor using the nonlinear Sagnac effect;

wherein the ring lasers, the another laser, the passive waveguide, and the photodetector are arranged into a monolithically integrated optoelectronic integrated circuit on a single substrate, and b) rotating the rotation sensor.

23. A method of sensing rotation, comprising:
a) providing a laser gyroscope rotation sensor by:
providing a first unidirectional ring laser arranged in a first ring arrangement designed to utilize a nonlinear Sagnac effect;
providing a second unidirectional ring laser arranged in a second ring arrangement designed to utilize a nonlinear Sagnac effect;
providing a three-port passive waveguide combiner arranged to combine the output light from the first and second unidirectional ring lasers into a single waveguide;
providing a first passive waveguide arranged to couple the light from the first ring arrangement to the three-port waveguide combiner;
providing a second passive waveguide arranged to couple the light from the second ring arrangement to the three-port waveguide combiner;
providing a third passive waveguide arranged to further guide the light generated by the first and second lasers by collecting it at the three-port waveguide combiner and mixing it together;
providing a photodetector arranged to receive the light generated by the first and the second ring arrangements and to detect rotation of the sensor using the nonlinear Sagnac effect;
wherein the first unidirectional, ring laser, the second unidirectional ring laser, the three-port passive waveguide combiner, the first passive waveguide, the second passive waveguide, the third passive waveguide, and the photodetector are arranged into a monolithically integrated optoelectronic integrated circuit on a single substrate, and b) rotating the rotation sensor.

24. The method according to claim 23, further providing a redirecting waveguide in each of the ring arrangements, strongly coupled to the waves propagating in the undesirable direction.

25. The method according to claim 24, wherein the redirecting waveguides are arranged to be straight waveguides.

26. The method according to claim 24, wherein the redirecting waveguides are arranged to be S-shaped.

27. The method according to claim 23, wherein the unidirectional ring lasers are arranged to have a compound cavity structure effective to reduce the number of longitudinal modes in a large ring cavity, and thereby to increase the power in the driving wave(s).

28. The method according to claim 27, wherein the compound-cavity unidirectional ring lasers are formed by connecting two or more rings together using three-port couplers.

29. The method according to claim 27, wherein the compound-cavity unidirectional ring lasers are formed by connecting two or more rings together through their evanescent fields.

30. The method according to claim 23, wherein the three-port passive waveguide combiner is arranged to include a Y-junction passive waveguide combiner.

31. The method according to claim 23, wherein the compound-cavity unidirectional ring lasers coupled by three-port couplers each include one or more Y-junction waveguide splitters and combiners.

32. The method according to claim 23, wherein the lasing light generated by the first laser is arranged to propagate in a single direction in the first ring arrangement and the lasing light generated by the second laser is arranged to propagate in the opposite single direction in the second ring arrangement.

33. The method according to claim 23, further providing one or more heater modules arranged to tune the first ring arrangement and the second ring arrangement to each other and to control modal content of compound cavity ring resonators.

34. The method according to claim 23, wherein the first passive waveguide is arranged to form a directional coupler with the first ring arrangement and the second passive waveguide is arranged to form a directional coupler with the second ring arrangement.

35. The method according to claim 23, wherein the third passive waveguide leading the light from the ring lasers to the photodetector is arranged to have a tapered end, and the photodetector facet is arranged to be oriented at the Brewster angle with respect to the waveguide axis, in order to reduce or eliminate possible reflections back to the ring lasers.

36. The method according to claim 23 further comprising one or more monitoring photodetectors, arranged to monitor operation and signal passage in the sensor, with corresponding waveguides arranged to lead the light from the first and/or second ring arrangements to the monitoring photodetectors.

37. The method according to claim 36, wherein the waveguides leading the light from the ring lasers to the monitoring photodetectors are arranged to form directional couplers with the first and second ring arrangements.

38. The method according to claim 36, wherein the waveguides leading the light from the ring lasers to the monitoring photodetectors are arranged to have tapered ends, and the photodetector facets are arranged to be oriented at the Brewster angle with respect to the waveguide axis, in order to reduce or eliminate possible reflections back to the ring lasers.

39. The method according to claim 23, wherein the signal from the third passive waveguide is arranged to be directed out from the chip and collected outside the chip for further analysis.

40. The method according to claim 23, wherein the signals from the first and second passive waveguides are arranged to be directed out from the chip and combined outside the chip for further analysis.

41. The method according to claim 23, further comprising arranging the photodetector to detect a beating signal produced by coupling the signals from the first ring arrangement and the second ring arrangement, said signals resulting from the nonlinear Sagnac effect produced by rotation of the sensor.

42. The method according to claim 41, wherein the beating signal corresponds to a slope sensitivity that is used to determine a rotation rate of the sensor.

* * * * *